United States Patent
Jian et al.

(10) Patent No.: US 11,018,009 B2
(45) Date of Patent: May 25, 2021

(54) TUNING WORK FUNCTION OF P-METAL WORK FUNCTION FILMS THROUGH VAPOR DEPOSITION

(71) Applicant: APPLIED MATERIALS, INC., Santa Clara, CA (US)

(72) Inventors: Guoqiang Jian, San Jose, CA (US); Wei Tang, Santa Clara, CA (US); Chi-Chou Lin, San Jose, CA (US); Paul Ma, Santa Clara, CA (US); Yixiong Yang, San Jose, CA (US); Mei Chang, Saratoga, CA (US); Wenyi Liu, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 54 days.

(21) Appl. No.: 16/381,776

(22) Filed: Apr. 11, 2019

(65) Prior Publication Data
US 2019/0326120 A1 Oct. 24, 2019

Related U.S. Application Data

(60) Provisional application No. 62/660,235, filed on Apr. 19, 2018.

(51) Int. Cl.
*H01L 21/28* (2006.01)
*H01L 21/285* (2006.01)
(Continued)

(52) U.S. Cl.
CPC .... *H01L 21/28088* (2013.01); *H01L 21/0228* (2013.01); *H01L 21/02205* (2013.01);
(Continued)

(58) Field of Classification Search
CPC ......... H01L 21/28088; H01L 21/28506; H01L 21/0228; H01L 21/02205;
(Continued)

(56) References Cited

U.S. PATENT DOCUMENTS 6,506,676 B2 * 1/2003 Park .................. C23C 14/048
257/E21.17
2010/0068877 A1 3/2010 Yeh et al.
(Continued)

FOREIGN PATENT DOCUMENTS

KR 10-1843227 B1 3/2018

OTHER PUBLICATIONS

PCT Search Report for PCT/US2019/027053 dated Jul. 24, 2019.

*Primary Examiner* — Ermias T Woldegeorgis
(74) *Attorney, Agent, or Firm* — Moser Taboada

(57) ABSTRACT

The present disclosure relates to a method for forming a p-metal work function nitride film having a desired p-work function on a substrate, including: adjusting one or more of a temperature of a substrate, a duration of one or more temporally separated vapor phase pulses, a ratio of a tungsten precursor to a titanium precursor, or a pressure of a reaction to tune a work function of a p-metal work function nitride film to a desired p-work function, and contacting the substrate with temporally separated vapor phase pulses of the tungsten precursor, the titanium precursor, and a reactive gas to form a p-metal work function nitride film thereon having the desired p-work function.

17 Claims, 4 Drawing Sheets

(51) Int. Cl.
*H01L 29/49* (2006.01)
*H01L 21/02* (2006.01)
*H01L 21/324* (2006.01)
*H01L 29/78* (2006.01)
*H01L 21/67* (2006.01)
*H01L 29/66* (2006.01)

(52) U.S. Cl.
CPC ...... *H01L 21/28506* (2013.01); *H01L 21/324* (2013.01); *H01L 21/67017* (2013.01); *H01L 21/67248* (2013.01); *H01L 29/4966* (2013.01); *H01L 29/66795* (2013.01); *H01L 29/785* (2013.01); *H01L 2029/7858* (2013.01)

(58) Field of Classification Search
CPC ........... H01L 2029/7858; H01L 21/324; H01L 29/66795; H01L 29/785; H01L 21/67017; H01L 21/67248
See application file for complete search history.

(56) References Cited

U.S. PATENT DOCUMENTS

| | | |
|---|---|---|
| 2010/0140717 A1 | 6/2010 | Lavoie et al. |
| 2014/0120712 A1 | 5/2014 | Ganguli et al. |
| 2015/0171177 A1 | 6/2015 | Cheng et al. |

* cited by examiner

TUNING WORK FUNCTION OF P-METAL WORK FUNCTION FILMS THROUGH VAPOR DEPOSITION

CROSS-REFERENCE

This application claims benefit of U.S. provisional patent application Ser. No. 62/660,235, filed Apr. 19, 2018 which is herein incorporated by reference in its entirety.

FIELD

Embodiments of the present disclosure generally relate to the field of semiconductor manufacturing processes, more particularly, to vapor deposition methods for work function tuning of a p-metal film.

BACKGROUND

P-metal films are being increasingly used in metal-oxide-semiconductor field-effect-transistors (MOSFETs) such as fin field-effect transistors (FinFET) in the 10 nm technology node and beyond, however the inventors have observed that many challenges remain in the art. For example, the development of transistor technology to more advanced nodes (n<10 nm) requires development of low resistivity work function metal (e.g., p-metal) in transistor devices. Further, the threshold voltage (Vt) tuning range is greatly limited by the traditional film thickness scaling because of limited space available in gate structures. Thus, the capability of tuning work function (such as multi-Vt tuning) without changing of film thickness becomes important for the work function control of a p-metal film.

Moreover, the inventors have observed that while some metal nitride carbide films have desirable work function, they may suffer from high resistivity which limits their applications as work function materials in FinFET devices.

Accordingly, the inventors have observed that the ability of gaining desirable p-work function tuning and low resistivity without thickness scaling are important for FinFET devices with smaller sizes.

Therefore, the inventors have provided a method of forming one or more p-metal work function films and tuning the work function of one or more p-metal work function films.

SUMMARY

Methods for forming a p-metal work function film having a desired p-work function are provided herein. In some embodiments, a method for forming a p-metal work function nitride film having a desired p-work function on a substrate includes: adjusting one or more of a temperature of a substrate, a duration of one or more temporally separated vapor phase pulses, a ratio of a tungsten precursor to a titanium precursor, or a pressure of a reaction to tune a work function of a p-metal work function nitride film to a desired p-work function, and contacting the substrate with temporally separated vapor phase pulses of the tungsten precursor, the titanium precursor, and a reactive gas to form a p-metal work function nitride film thereon having the desired p-work function.

In some embodiments, a method for forming one or more p-metal work function films over a substrate in a reaction to have a desired p-work function includes: adjusting one or more process parameters of a reaction to tune a work function of one or more p-metal work function nitride films to a desired p-work function; and alternately and sequentially contacting the substrate with temporally separated vapor phase pulses of one or more metal source chemicals, and one or more reactive gases to form one or more p-metal work function nitride films having a desired work function.

In some embodiments, the present disclosure relates to a non-transitory computer readable medium having instructions stored thereon that, when executed, cause a method of forming a p-metal work function nitride film having a desired p-work function on a substrate in a process chamber, comprising: adjusting one or more of a temperature of a substrate, a duration of one or more temporally separated vapor phase pulses, a ratio of a tungsten precursor to a titanium precursor, or a pressure of a reaction to tune a work function of a p-metal work function nitride film to a desired p-work function, and contacting the substrate with temporally separated vapor phase pulses of the tungsten precursor, the titanium precursor, and a reactive gas to form a p-metal work function nitride film thereon having the desired p-work function.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
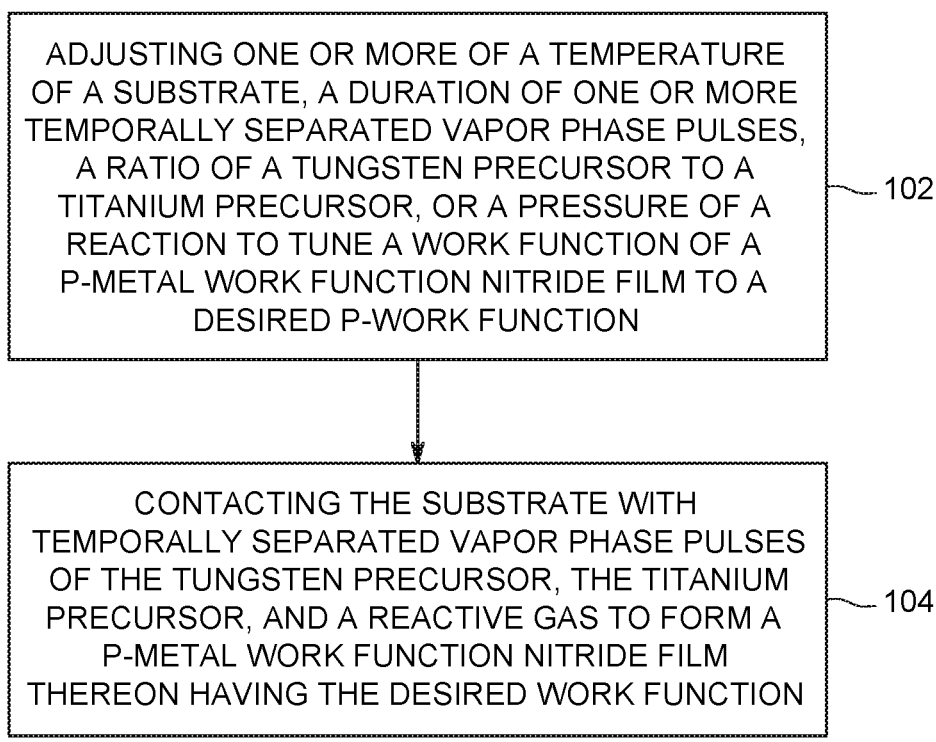
FIG. 1 depicts a flow diagram of a method for forming a p-metal work function nitride film on a substrate having a desired work function in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure provide methods for forming one or more p-metal work function films over a substrate that advantageously tune the work function of the one or more p-metal work function nitride films. A tuned work function in accordance with the present disclosure may be suitable to obtain a desired threshold voltage (Vt) in a semiconductor device. Thus, embodiments of the present disclosure may advantageously be used during different chemical vapor deposition (CVD) and atomic layer deposition (ALD) processes or devices that may be subjected to further processing. In some embodiments, methods of the present disclosure advantageously provide p-metal work function nitride films having a desired or predetermined p-work function suitable for use in fin field-effect transistors (FinFET) in the 10 nm technology node and beyond. In embodiments, the desired work function of a p-metal film of the present disclosure is predetermined. For example, the desired work function of a p-metal film of the present disclosure may be targeted to be above 4.8 eV, or greater than 4.8 eV to about 5.0 eV, 4.9 eV to 5.0 eV, about 4.9 eV to about 5.0 ev, about 5.0 eV, or 5.0 eV.

FIG. 1 is a flow diagram of a method 100 for forming a p-metal work function nitride film on a substrate having a desired work function in accordance with some embodiments of the present disclosure. The method 100 is described below with respect to the stages of processing a substrate and may be performed, for example, in a suitable wafer processing system. Exemplary processing systems that may be used to perform the methods disclosed herein may include, but are not limited to, any of the ENDURA®, CENTURA®, or PRODUCER® brand processing systems, commercially available from Applied Materials, Inc., of Santa Clara, Calif. One example of a suitable ALD wafer processing system is shown and described in U.S. Pat. No. 7,238,552 entitled Method and Apparatus for Depositing Tungsten After Surface Treatment to Improve Film Characteristics, granted Jul. 3, 2007 to Applied Materials Inc. Other process chambers, including ones available from other manufacturers, may also be suitably used in connection with the teachings provided herein.

The method 100 is typically performed on a substrate, such as semiconductor substrate and glass substrate, as well as layers formed there over, such as dielectric layers (e.g., $SiO_2$) and barrier layers (e.g., titanium, titanium nitride and the like). In some embodiments, the substrate may be a high-k dielectric layer provided to a processing volume of a process chamber. The high-k dielectric layer may be any suitable layer having a high dielectric constant as compared to silicon dioxide (3.9). A non-limiting example of a high-k dielectric material includes materials having a dielectric constant greater than 7. The high-k dielectric layer may include a metal oxide. Non-limiting examples of suitable metal oxides for use in accordance with the present disclosure include an oxide containing a metal such as hafnium (Hf). For example, the metal oxide may include hafnium oxide or $HfO_2$. Non-limiting examples of high-k dielectric materials suitable as a substrate in accordance with the present disclosure may further include $HfO_2$, $TiO_2$, $Ta_2O_5$, $CeO_2$, $BaZrTiO_3$, $Al_2O_3$, and combinations thereof. In embodiments, the substrate has a thickness of 1 to 5 nm. In embodiments, the substrate is formed by one of physical vapor deposition, chemical vapor deposition, and atomic layer deposition.

In embodiments of the present disclosure, a p-metal work function nitride film is formed or deposited by an ALD process, a CVD process, or derivatives thereof on top of and contacting a substrate such as those described above. Referring back to FIG. 1, the process includes at 102 adjusting one or more of a temperature of a substrate, a duration of one or more temporally separated vapor phase pulses, a ratio of a tungsten precursor to a titanium precursor, or a pressure of a reaction to tune the work function of a p-metal work function nitride film. The process described at 102 may be performed before, after, or during 104 further described below. In embodiments, suitable p-metal work function nitride film include films including tungsten (W), titanium (Ti) and combinations thereof, for examples films such as WTiNC film, or $W_xTi_yNC$ film.

In embodiments, the temperature of a substrate may be set in a deposition depending on the specific deposition process, such as e.g., ALD. In embodiments, the temperature of one or more temporally separated vapor phase pulses, of a reaction may be adjusted to tune the work function of a p-metal work function nitride film. The substrate may be heated in a reaction chamber such as process chamber 16 in FIG. 5 to a desired temperature prior to layer deposition via a heater embedded within a pedestal. For example, a pedestal may be resistively heated by applying an electric current from a power supply to a heater element disposed in the pedestal. The substrate is, in turn, heated and can be maintained within a desired process temperature range of, for example, about 250° C. to about 500° C. In some embodiments, the temperature of the substrate is between about 375° C. to about 400° C. A temperature sensor, such as a thermocouple, may also be embedded in a wafer support pedestal to monitor the temperature of pedestal in a conventional manner.

In embodiments, the duration of one or more temporally separated vapor phase pulses, of a reaction may be adjusted to tune the work function of a p-metal work function nitride film. For example, a first vapor phase pulse including a metal organic precursor such as a precursor including tungsten, nitrogen, carbon and hydrogen may be deposited on the substrate in a deposition process such as ALD. Other non-limiting examples of first precursors include tungsten precursor such as one or more of $WCl_6$, $WCl_6$, $WF_6$, bis(tert-butylimido)-bis(dimethylamido)tungsten-(VI), or the like. The first precursor may be supplied in an amount sufficient to form a first layer upon the top surface of the substrate, such as an amount sufficient to contribute to the formation of one or more p-metal work function nitride films having a thickness of between about 10 angstroms to about 50 angstroms. In embodiments, the duration of the vapor phase pulses is between about 0.1 seconds to 10 seconds. In some embodiments, the duration of a first vapor phase pulse or duration of one or more temporally separated vapor phase pulses is tuned to change the film work function of a p-metal work function nitride film to a desired work function. In embodiments, the duration of the vapor phase pulses is changed in an amount between about 0.2 seconds to 9.9 seconds.

In embodiments, the duration of a second temporally separated vapor phase pulse, of a reaction may be adjusted to tune the work function of a p-metal work function nitride film to a desired value. For example, a second vapor phase pulse including a metal precursor such as a precursor including titanium may be deposited on the substrate in a deposition process such as ALD. Other non-limiting examples of second precursors include titanium precursor such as one or more of $TiCl_4$, tetrakis(dimethylamido) titanium (TDMAT), tetrakis(diethylamido)titanium (TDEAT), or the like, or combinations thereof. In embodiments, a suitable second precursor is $TiCl_4$. The second precursor may be supplied in an amount sufficient to form a layer upon the layer formed by the first precursor over the top surface of the substrate, such as an amount sufficient to contribute to the formation of one or more p-metal work function nitride films having a thickness of between about 10 angstroms to about 50 angstroms. In embodiments, the duration of the second vapor phase pulses is between about 0.1 seconds to 10 seconds. In some embodiments, the duration of a second vapor phase pulse is adjusted to tune the work function of a p-metal work function nitride film. In embodiments, the duration of the second vapor phase pulses is changed in an amount between about 0.2 seconds to 9.9 seconds.

In embodiments, a ratio of a tungsten precursor to a titanium precursor of a reaction may be adjusted to tune the work function of a p-metal work function nitride film to a desired value. For example, where the first precursor is a tungsten precursor, and the second precursor is a titanium precursor the amounts of each precursor forming the film may be adjusted to tune the work function of a p-metal work function nitride film to a desired value. In embodiments, tungsten rich films are formed where the percentage of tungsten present in the film is significantly greater than the amount of titanium in the film. In embodiments, tungsten is present in an amount of 1, 2, 5, 10, to 20 times greater than titanium in the film. Similarly, the formation of Ti rich films may tune the work function of a p-metal work function nitride film. In embodiments, titanium is present in an amount of 1, 2, 5, 10, to 20 times greater than tungsten in the film. In embodiments, tungsten precursor to titanium are applied in a ratio of tungsten precursor to titanium precursor between 1:99 and 99:1. The selected ratio is suitable to tune the work function of a p-metal work function nitride film. In embodiments, increasing the tungsten, or tungsten component will provide a higher p-work function film, and may reduce the Vt in the semiconductor device having the p-work function film disposed within or upon, such as a transistor. In embodiments, increasing the titanium, or titanium component will provide a lower p-work function film, and may increase the Vt in the semiconductor device having the p-work function film disposed within or upon, such as a transistor.

In embodiments, a pressure of a reaction may be adjusted to tune the work function of a p-metal work function nitride film to a desired p-work function. A vacuum pump may also be used to evacuate processing chamber and to help maintain the proper gas flows and pressure inside processing chamber. In embodiments, the pressure of the reaction is between about 1 Torr to 50 Torr, or between about 5 Torr to 25 Torr.

Referring back to FIG. 1, 104 includes contacting the substrate with temporally separated vapor phase pulses of the tungsten precursor, the titanium precursor, and the reactive gas (each added individually) to form a p-metal work function nitride film thereon having a desired p-work function.

In embodiments, reactive gas is provided in an amount sufficient to react the first precursor and second precursor described above to form a p-metal nitride film. In embodiments, the reactive gas comprises ammonia, hydrazine, or combinations thereof in a vapor phase and supplied to the substrate and into the openings of the substrate in a reactive gas pulse.

In embodiments, after sufficient tungsten precursor, titanium precursor, and the reactive gas has been supplied to at least reach all surfaces over which deposition is desired, excess tungsten precursor, titanium precursor, and reactive gas (and any reactant by-product) is removed in one or more purge(s) or removal process following each temporally separated vapor phase pulse, such as and including by purging with inert gas.

Figure 2:
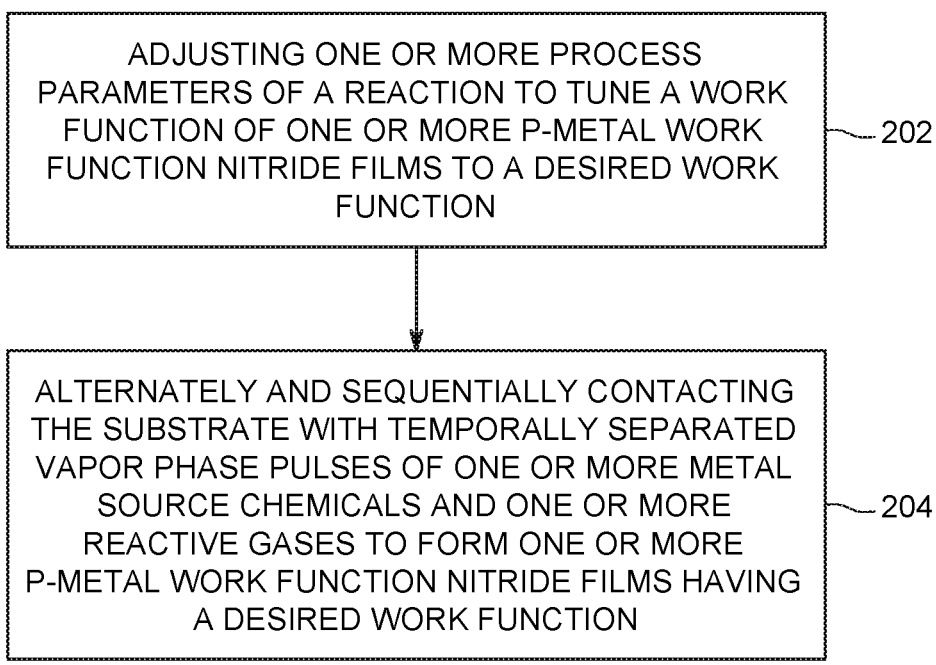
FIG. 2 depicts a flow diagram of a method for forming a p-metal work function nitride film on a substrate having a desired work function in accordance with some embodiments of the present disclosure.

FIG. 2 is a flow diagram of a method 200 for forming a p-metal work function nitride film on a substrate having a desired work function in accordance with some embodiments of the present disclosure. The method 200 is similar to method 100 with respect to the stages of processing a substrate and may be performed, for example, in a suitable wafer processing system. Moreover, method 200 may utilize the precursors and reactive gas mentioned above. However, processes in method 200 can also be applied to processes employing three or more reactants in alternated and temporally separated pulses, and that other additional reactants or conditions can be employed such that process parameters generally may be adjusted in order to tune the work function of a p-metal nitride film in accordance with the present disclosure. For example, for some applications, supplying two consecutive pulses of the same reactant, separated only by removal such as by a purge, may be advantageous. Further, in some applications, supplying a titanium precursor pulse prior to a tungsten precursor pulse, separated only by removal such as by a purge, prior to application of reactive gas as described above to form the p-metal films of the present disclosure, may be advantageous. Still referring to FIG. 2, the method 200 relates to forming one or more p-metal work function films over a substrate to have a desired p-work function. At process sequence 202, the method 200 includes adjusting one or more process parameters of a reaction to tune a work function of one or more p-metal work function nitride films to a desired p-work function. Further at 204, the method 200 includes alternately and sequentially contacting the substrate with temporally separated vapor phase pulses of one or more metal source chemicals, and one or more reactive gases to form one or more p-metal work function nitride films having a desired work function. In some embodiments the one or more process parameters is one or more of a temperature of the substrate, a duration of a temporally separated vapor phase pulses, or a pressure of the reaction to tune a work function of the one or more p-metal work function nitride films. In one embodiment, one process parameter is temperature of the substrate suitable for preselection or adjustment in accordance with the present disclosure. In one embodiment, one process parameter is duration of a temporally separated vapor phase pulses suitable for preselection or adjustment in accordance with the present disclosure. In one embodiment, a pressure of the reaction is a process parameter suitable for preselection or adjustment in accordance with the present disclosure. In one embodiment, a suitable metal source chemical for use herein includes tungsten precursor and titanium precursor, wherein the tungsten precursor and titanium precursor are applied in a ratio between 1:99 and 99:1.

Figure 3:
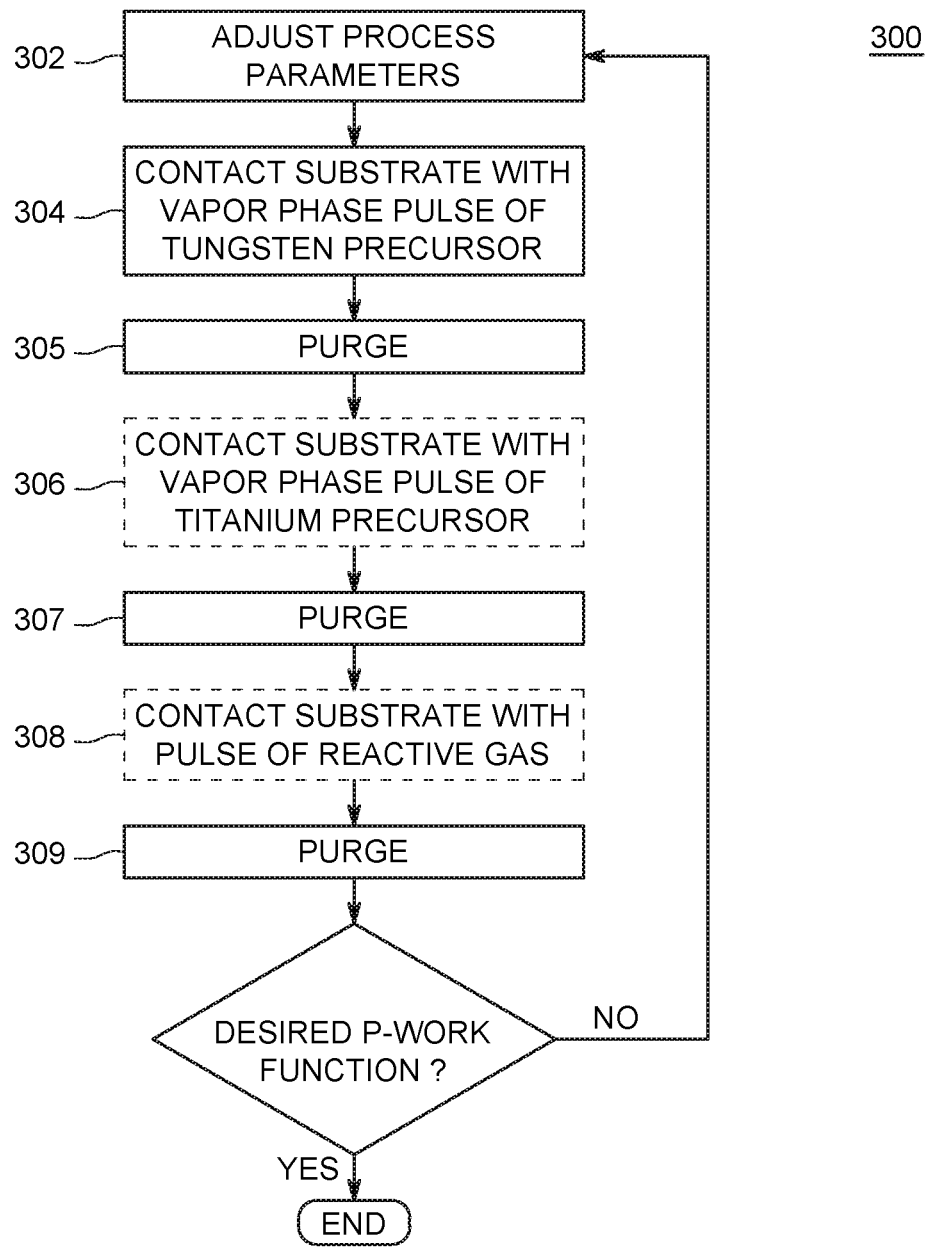
FIG. 3 depicts a flow diagram of a method for forming a p-metal work function nitride film on a substrate having a desired work function in accordance with some embodiments of the present disclosure.

FIG. 3 is a flow chart generally illustrating an alternating and sequential deposition process in accordance with embodiments of the present disclosure. In embodiments, process parameters are adjusted at 302 by, for example, adjusting one or more of a temperature of a substrate, a duration of one or more temporally separated vapor phase pulses, a ratio of a tungsten precursor to a titanium precursor, or a pressure of a reaction to tune the work function of a p-metal work function nitride film to achieve a desired p-work function value. In embodiments, a first precursor is supplied to the substrate and into openings in the substrate in a first precursor pulse 304. After sufficient precursor such as tungsten precursor has been supplied to at least reach all surfaces over which deposition is desired, excess first reactant (and any reactant by-product) is removed in a first removal or purge 305. Removal or purge 305 can include pumping down to vacuum; however, removal can also be accomplished by supplying inert gas as a purge. Undesirable gas phase reactions between the first and second precursors in the reaction space above the substrate are avoided by the removal, which is optimized to be as short as possible while ensuring spatial and temporal separation of mutually reactive reactants. The first precursor pulse 304 and the first removal or purge 305 together represent a first reactant phase.

Subsequently a second precursor such as titanium precursor in a vapor phase is supplied to the substrate and into the openings of the substrate in a second precursor pulse 306. After sufficient second precursor has been supplied to at least reach all surfaces over which deposition is desired, excess second precursor (and any reactant by-product) is removed in a second removal 307, which may include purging with inert gas. The second precursor pulse 306 and the second removal 307 together represent a second phase. Second precursor pulse 306 in FIG. 3 is shown in phantom to show embodiments where second precursor pulse 306 and reactive gas pulse 308 are optionally interchangeable. For example, reactive gas pulse 308 described below may follow purge 305, and second precursor pulse 306 may optionally follow second removal 307.

A reactive gas such as ammonia, hydrazine, or combinations thereof in a vapor phase is supplied to the substrate and into the openings of the substrate in a reactive gas pulse 308. After sufficient reactive gas has been supplied to at least reach all surfaces over which deposition is desired, excess reactive gas (and any reactant by-product) is removed in a third removal 309, which may include purging with inert gas. The reactive gas pulse 308 and the third removal 309 together represent a third phase, and the first, second, and third phases together represent a cycle of the alternating and sequential deposition process. The cycle is then repeated as many times as desired until a film of the desired thickness is formed. Moreover, as described above the process parameters 302 may be changed in accordance with the present disclosure to tune the work function of a p-metal work function nitride film to a desired threshold voltage.

In embodiments, the first precursor and the second precursor may be plasma-activated. For example, the plasma-activated precursor is activated in situ within a reactor directly over the substrate upper surface to provide a uniform supply of activated species across the substrate.

Figure 4:
FIG. 4 depicts a PMOS transistor, including a substrate and p-metal work function nitride film suitable for use in accordance with the present disclosure.

Referring to FIG. 4, in embodiments, tungsten nitride films 402 of the present disclosure are suitable for use in a PMOS transistor 400, for example, a PMOS transistor 400 including: a substrate 404 suitable for nodes of less than 10 nanometers including a first surface and a work function metal having a thickness of 10 to 50 angstroms disposed upon a top surface of the substrate, wherein the work function metal comprises a predetermined desired work function. In embodiments, the PMOS transistor includes p-metal work function nitride film including films comprising tungsten (W), titanium (Ti) and combinations thereof, for examples films such as WTiNC film, or $W_xTi_yNC$ film. In embodiments, the p-metal work function nitride film a desired work function which is predetermined. For example, the desired work function of a p-metal film of the present disclosure may be targeted and predetermined to be above 4.8 eV, or greater than 4.8 eV to about 5.0 eV, 4.9 eV to 5.0 eV, about 4.9 eV to about 5.0 ev, about 5.0 eV, or 5.0 eV.

Figure 5:
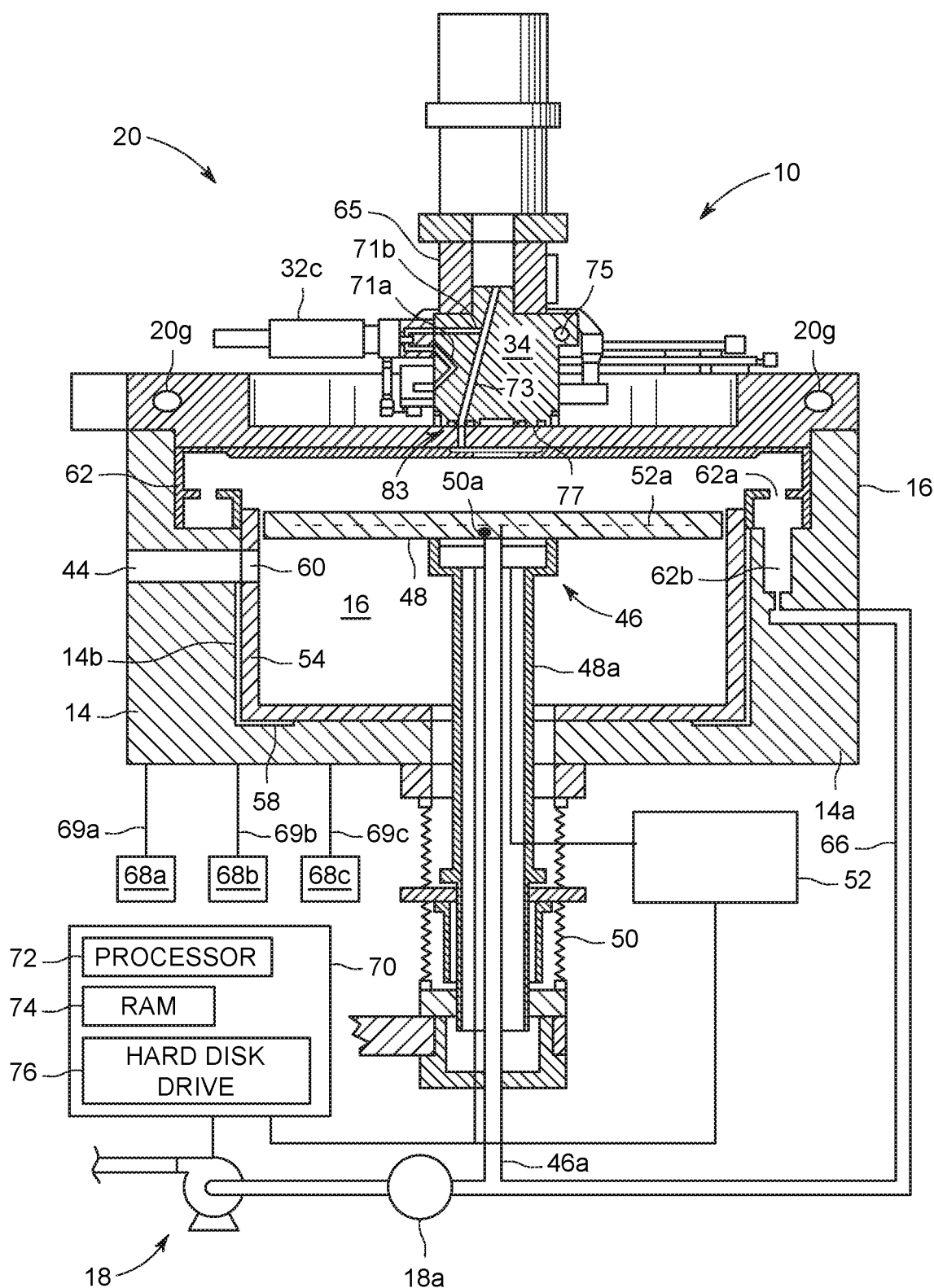
FIG. 5 depicts a deposition chamber suitable for forming a p-metal work function nitride film on a substrate having a desired work function in accordance with some embodiments of the present disclosure.

Referring now to FIG. 5, a process chamber 16 suitable for forming a p-metal work function nitride film on a substrate having a desired work function in accordance with the present disclosure is shown. In embodiments, process chamber 16 may be configured to operate in both CVD mode and a cyclical deposition mode (ALD). Referring to FIG. 5, disposed within process chamber 16 is a heater/lift assembly 46 that includes a support pedestal 48 connected to a support shaft 48a suitable for supporting a wafer. The support pedestal 48 is positioned between the support shaft 48a and the lid assembly 20 when the lid assembly 20 is in the closed position. The support shaft 48a extends from the support pedestal 48 away from lid assembly 20 through a passage formed in the housing 14. A bellows 50 is attached to a portion of the housing 14 disposed opposite to the lid assembly 20 to prevent leakage into the process chamber 16 from between the support shaft 48a and housing 14. The heater/lift assembly 46 may be moved vertically within the process chamber 16 so that a distance between support pedestal 48 and lid assembly 20 may be controlled. A sensor (not shown) provides information concerning the position of support pedestal 48 within process chamber 16.

The support pedestal 48 includes an embedded thermocouple 50a that may be used to monitor the temperature thereof. For example, a signal from the thermocouple 50a may be used in a feedback loop to control power applied to a heater element 52a by a power source 52. The heater element 52a may be a resistive heater element or other thermal transfer device disposed in or in contact with the support pedestal 48 utilized to control the temperature thereof. Optionally, support pedestal 48 may be heated using a heat transfer fluid (not shown).

The support pedestal 48 may be formed from any process-compatible material, including aluminum nitride and aluminum oxide and may also be configured to hold a substrate (not shown) thereon employing a vacuum, i.e. support pedestal 48 may be a vacuum chuck. To that end, support pedestal 48 may include a plurality of vacuum holes (not shown) that are placed in fluid communication with a vacuum source, such as pump system via vacuum tube routed through the support shaft 48a.

A liner assembly is disposed in the process chamber 16 and includes a cylindrical portion 54 and a planar portion. The cylindrical portion 54 and the planar portion may be formed from any suitable material such as aluminum, ceramic and the like. The cylindrical portion 54 surrounds the support pedestal 48. The cylindrical portion 54 additionally includes an aperture 60 that aligns with the slit valve opening 44 disposed a side wall 14b of the housing 14 to allow entry and egress of substrates from the process chamber 16.

Disposed along the side walls 14b of the process chamber 16 proximate the lid assembly 20 is a pumping channel 62. The pumping channel 62 includes a plurality of apertures, one of which is shown as a first aperture 62a. The pumping channel 62 includes a second aperture 62b that is coupled to a pump system 18 by a conduit 66. A throttle valve 18A is coupled between the pumping channel 62 and the pump system 18. The pumping channel 62, throttle valve 18A and pump system 18 control the amount of flow from the process chamber 16. The size and number and position of apertures such as first aperture 62a in communication with the process chamber 16 are configured to achieve uniform flow of gases exiting the lid assembly 20 over support pedestal 48 and substrate when seated thereon. A plurality of supplies 68a, 68b and 68c of process and/or other fluids, are in fluid communication with one of valves 32a, 32b or 32c through a sequence of conduits (not shown) formed through the housing 14, lid assembly 20, and gas manifold 34.

A controller 70 regulates the operations of the various components of system 10. The controller 70 includes a processor 72 in data communication with memory, such as random access memory 74 and a hard disk drive 76 and is in communication with at least the pump system 18, the power source 52, and valves 32a, 32b and 32c.

Although any type of process fluid may be employed, one example of process fluids are tungsten precursors, titanium precursors, and a reactive gas as described above, and optionally a purge fluid. The chamber pressure may be in the pressure range as described above, and the support pedestal 48 is heated such that the substrate may be maintained at a set temperature, such as the substrate at a temperature described herein above. In embodiments, the process fluids such as tungsten precursors, the titanium precursors, and a reactive gas may be flowed into the process chamber 16 with a carrier fluid, such as Ar. However, the purge fluid might differ from the carrier fluid or precursors, or co-reactants.

In vapor deposition embodiments in accordance with the present disclosure, the methods include performing a chemical vapor deposition (CVD) process in a process chamber such as process chamber 16 by adjusting one or more of: the temperature of the substrate, the duration of one or more temporally separated vapor phase pulses, the ratio of a tungsten precursor to a titanium precursor, or the pressure of a reaction in order to tune a work function of a p-metal work function nitride film to a desired p-work function. In embodiments, the process chamber is suitable for contacting the substrate with temporally separated vapor phase pulses of one or more tungsten precursors, one or more titanium precursors, and a reactive gas to form a p-metal work function nitride film thereon having the desired p-work function.

In some embodiments, vapor deposition embodiments in accordance with the present disclosure include methods include performing a chemical vapor deposition (CVD) process in a process chamber such as process chamber 16 by adjusting one or more process parameters of a reaction to tune a work function of one or more p-metal work function nitride films to a desired p-work function. In embodiments, the process chamber is configured for alternately and sequentially contacting the substrate with temporally separated vapor phase pulses of one or more metal source chemicals, and one or more reactive gases to form one or more p-metal work function nitride films having a desired work function.

In another embodiment, a non-transitory computer readable medium having instructions stored thereon that, when executed, cause a deposition method such as e.g., a substrate treatment in accordance with the present disclosure. For example, in embodiments, a non-transitory computer readable medium having instructions stored thereon that, when executed, cause a substrate treatment method, within or processed through a deposition chamber, including adjusting one or more of a temperature of a substrate, a duration of one or more temporally separated vapor phase pulses, a ratio of a tungsten precursor to a titanium precursor, or a pressure of a reaction to tune a work function of a p-metal work function nitride film to a desired p-work function, and contacting the substrate with temporally separated vapor phase pulses of the tungsten precursor, the titanium precursor, and a reactive gas to form a p-metal work function nitride film thereon having the desired p-work function.

In another embodiment, a non-transitory computer readable medium having instructions stored thereon that, when executed, cause a deposition method such as e.g., a substrate treatment in accordance with the present disclosure. For example, in embodiments, a non-transitory computer readable medium having instructions stored thereon that, when executed, cause a substrate treatment method, within or processed through a deposition chamber, including adjusting one or more process parameters of a reaction to tune a work function of one or more p-metal work function nitride films to a desired p-work function; and alternately and sequentially contacting the substrate with temporally separated vapor phase pulses of one or more metal source chemicals, and one or more reactive gases to form one or more p-metal work function nitride films having a desired work function.

The above embodiments are described only in an exemplary manner, and there may be variations without departing from the protection scope defined by the appended claims.

The invention claimed is:

1. A method for forming a p-metal work function nitride film having a desired p-work function on a substrate, comprising:

adjusting one or more of a temperature of a substrate, a duration of one or more temporally separated vapor phase pulses, a ratio of a tungsten precursor to a titanium precursor, or a pressure of a reaction to tune a work function of a p-metal work function nitride film to a desired p-work function, and contacting the substrate with temporally separated vapor phase pulses of the tungsten precursor, the titanium precursor, and a reactive gas to form a p-metal work function nitride film thereon having the desired p-work function.

2. The method of claim 1, further comprising removing excess tungsten precursor, titanium precursor, and reactive gas after each vapor phase pulse.

3. The method of claim 2, wherein removing further comprises purging a reaction space with an inert gas.

4. The method of claim 1, wherein the temperature of the substrate is between about 250° C. to about 500° C.

5. The method of claim 1, wherein the temperature of the substrate is between about 375° C. to about 400° C.

6. The method of claim 1, wherein the temporally separated vapor phase pulses have a duration between about 0.1 seconds to 10 seconds.

7. The method of claim 1, wherein a duration of one or more temporally separated vapor phase pulses is between about 1 second to 5 seconds.

8. The method of claim 1, wherein the pressure of the reaction is between about 1 Torr to 50 Torr.

9. The method of claim 1, wherein the pressure of the reaction is between about 5 Torr to 25 Torr.

10. The method of claim 1, wherein the temperature of the substrate is between about 375° C. to about 400° C., wherein a duration of the temporally separated vapor phase pulses is between about 1 second to 5 seconds, wherein the pressure between about 5 Torr to 25 Torr.

11. The method of claim 1, wherein the p-metal work function nitride film further comprises carbide.

12. The method of claim 1, wherein the tungsten precursor comprises one or more of $WCl_5$, $WCl_6$, $WF_6$, bis(tert-butylimido)-bis(dimethylamido)tungsten-(VI).

13. The method of claim 1, wherein the titanium precursor comprises $TiCl_4$, TDMAT, TDEAT, or combinations thereof.

14. The method of claim 1, wherein the reactive gas comprises ammonia, hydrazine, or combinations thereof.

15. The method of claim 1, wherein the p-metal work function nitride film has a thickness of between about 10 angstroms to about 50 angstroms.

16. The method of claim 1, wherein the p-metal work function nitride film is deposited by an ALD process, a CVD process, or derivatives thereof.

17. A non-transitory computer readable medium having instructions stored thereon that, when executed, cause a method of forming a p-metal work function nitride film having a desired p-work function on a substrate in a process chamber, comprising:

adjusting one or more of a temperature of a substrate, a duration of one or more temporally separated vapor phase pulses, a ratio of a tungsten precursor to a titanium precursor, or a pressure of a reaction to tune a work function of a p-metal work function nitride film to a desired p-work function, and contacting the substrate with temporally separated vapor phase pulses of the tungsten precursor, the titanium precursor, and a reactive gas to form a p-metal work function nitride film thereon having the desired p-work function.

* * * * *

UNITED STATES PATENT AND TRADEMARK OFFICE
CERTIFICATE OF CORRECTION

| | | |
|---|---|---|
| PATENT NO. | : 11,018,009 B2 | Page 1 of 1 |
| APPLICATION NO. | : 16/381776 | |
| DATED | : May 25, 2021 | |
| INVENTOR(S) | : Guoqiang Jian et al. | |

It is certified that error appears in the above-identified patent and that said Letters Patent is hereby corrected as shown below:

In the Specification

Column 4, Line 33, delete "one or more of WCl6, WCl6," and replace with "one or more of WCl5, WCl6,"

In the Claims

Column 10, Line 46, in Claim 10, delete "pressure" and replace with "pressure is"

Signed and Sealed this
Thirteenth Day of July, 2021

Drew Hirshfeld
*Performing the Functions and Duties of the*
*Under Secretary of Commerce for Intellectual Property and*
*Director of the United States Patent and Trademark Office*